(12) United States Patent
Sharma et al.

(10) Patent No.: US 11,690,215 B2
(45) Date of Patent: Jun. 27, 2023

(54) SELF-ALIGNED BITLINE AND CAPACITOR VIA FORMATION

(71) Applicant: Intel Corporation, Santa Clara, CA (US)

(72) Inventors: Abhishek A. Sharma, Hillsboro, OR (US); Van H. Le, Portland, OR (US); Jack T. Kavalieros, Portland, OR (US); Tahir Ghani, Portland, OR (US); Yih Wang, Portland, OR (US); Benjamin Chu-Kung, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1011 days.

(21) Appl. No.: 15/943,576

(22) Filed: Apr. 2, 2018

(65) Prior Publication Data

US 2019/0304982 A1    Oct. 3, 2019

(51) Int. Cl.
    *H10B 12/00*    (2023.01)

(52) U.S. Cl.
    CPC ............. *H10B 12/34* (2023.02); *H10B 12/03* (2023.02); *H10B 12/36* (2023.02); *H10B 12/482* (2023.02); *H10B 12/485* (2023.02); *H10B 12/488* (2023.02)

(58) Field of Classification Search
    CPC ......... H01L 27/10823; H01L 27/10826; H01L 27/1085; H01L 27/10885; H01L 27/10888; H01L 27/10891; H10B 12/34; H10B 12/03; H10B 12/36; H10B 12/482; H10B 12/485; H10B 12/488; H10B 12/0335; H10B 12/315; H10B 12/31
    See application file for complete search history.

(56) References Cited

U.S. PATENT DOCUMENTS

| | | | | |
|---|---|---|---|---|
| 6,352,896 B1 * | 3/2002 | Liu | .................. | H01L 27/10888 257/E27.088 |
| 6,900,492 B2 * | 5/2005 | Takaura | ............ | H01L 21/76897 257/296 |
| 9,034,753 B2 * | 5/2015 | Schloesser | ........ | H01L 21/76816 438/668 |
| 2004/0183113 A1 * | 9/2004 | Park | .................. | H01L 27/10814 257/296 |

* cited by examiner

*Primary Examiner* — Dale E Page
*Assistant Examiner* — Quovaunda Jefferson
(74) *Attorney, Agent, or Firm* — Schwabe, Williamson & Wyatt, P.C.

(57) ABSTRACT

A method is described. The method includes forming bit line structures above bitline contact structures, forming a first material on top surfaces and sidewall surfaces of the bit line structures to establish step structures for via formation, and forming a second material on the top surface of the first material. Capacitor landing structures are formed by patterning the second material.

20 Claims, 9 Drawing Sheets

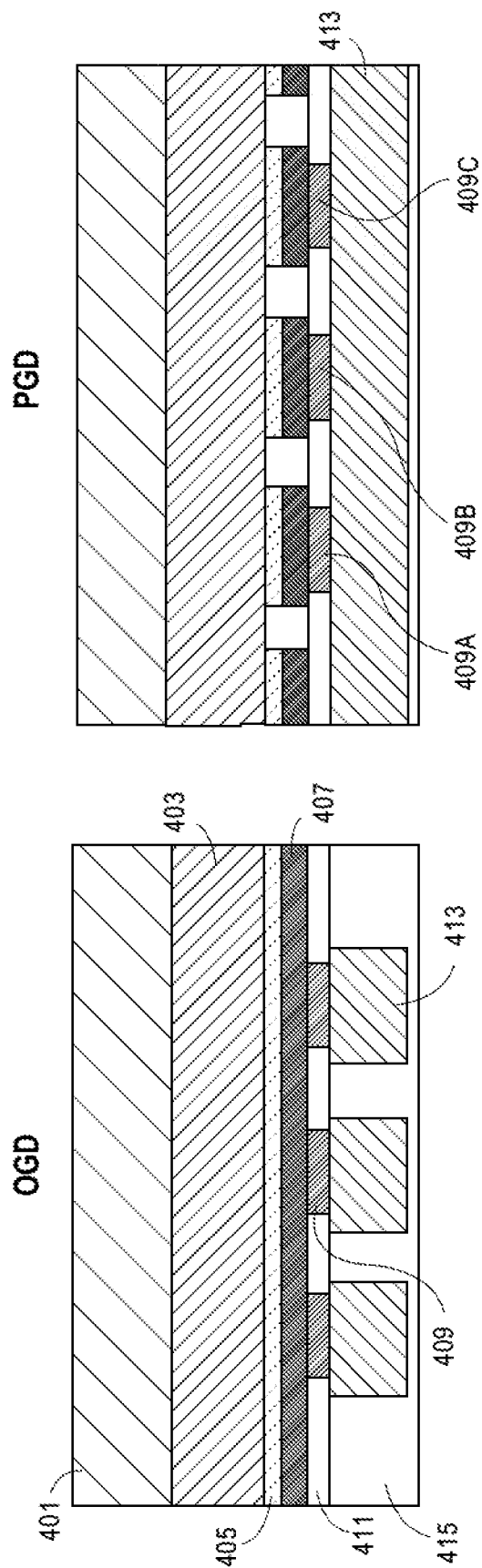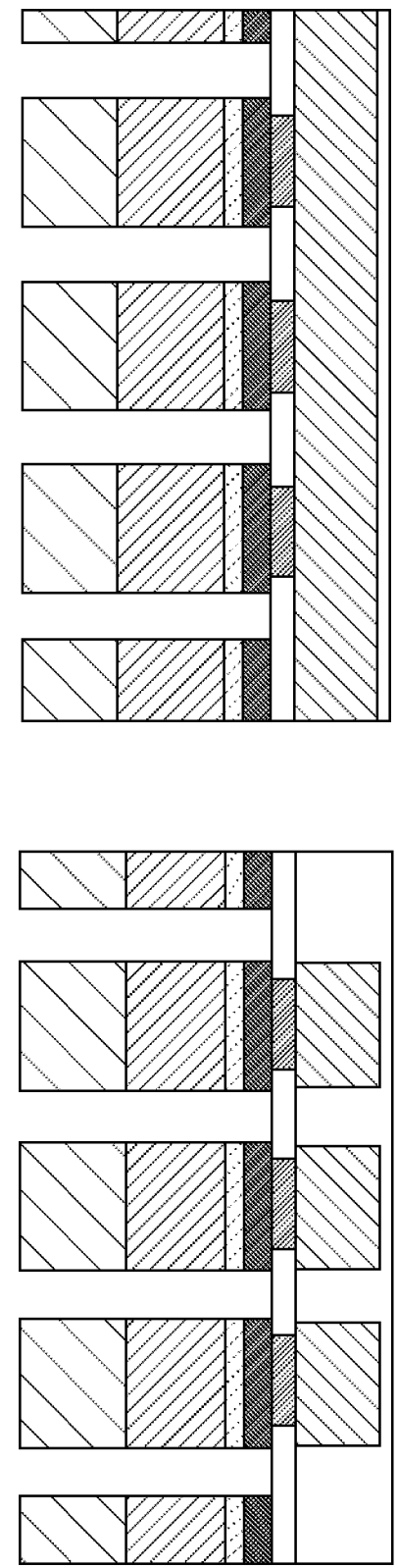
FIG. 4A
FIG. 4B

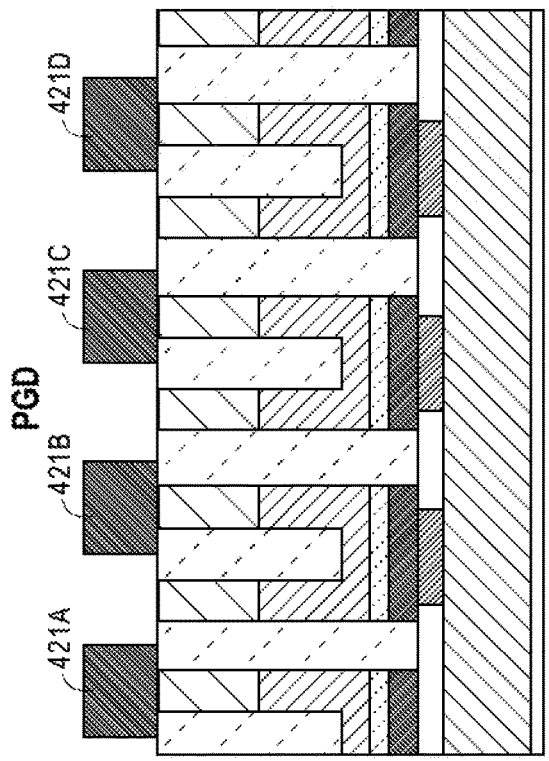
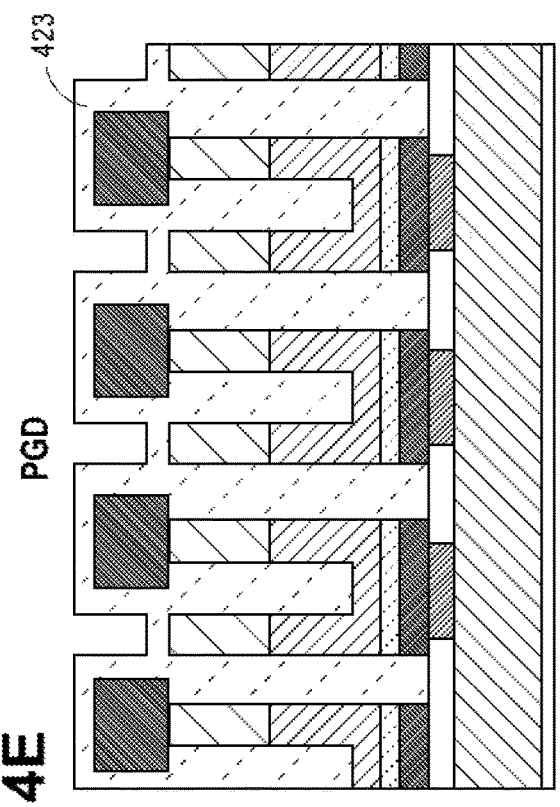
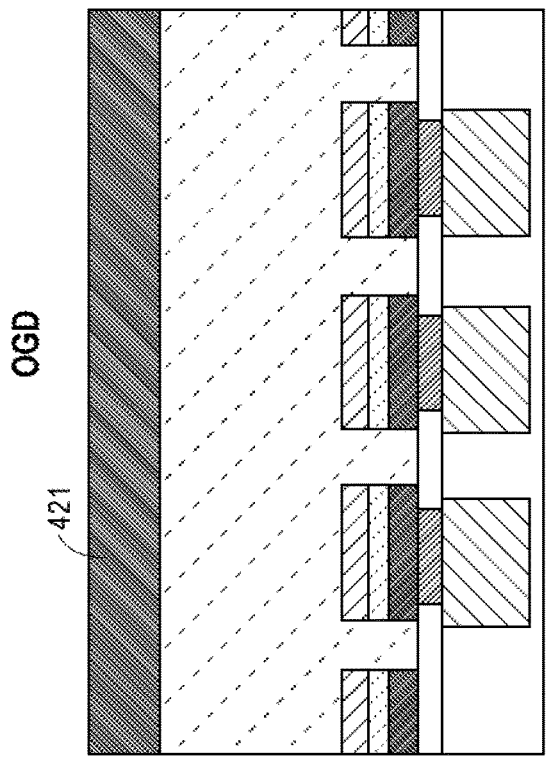
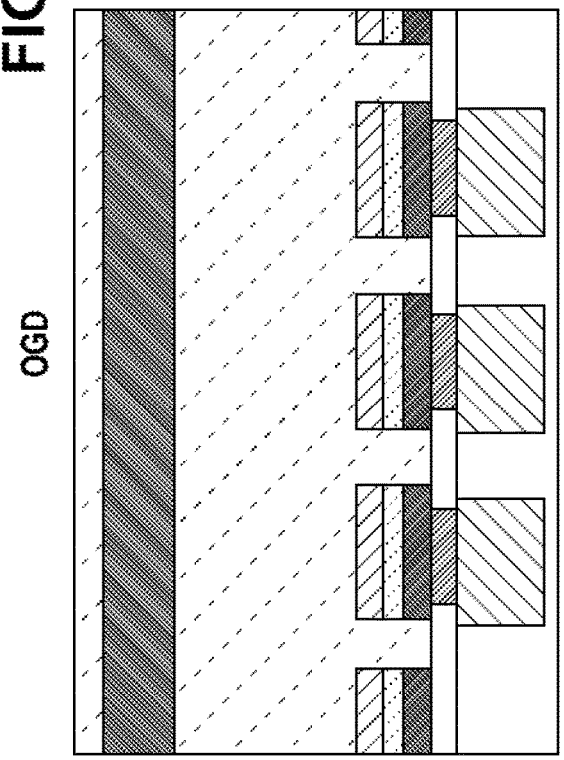
FIG. 4E
FIG. 4F

SELF-ALIGNED BITLINE AND CAPACITOR VIA FORMATION

TECHNICAL FIELD

Embodiments of the disclosure are in the field of bitline and capacitor via formation and, in particular, self-aligned bitline and capacitor via formation.

BACKGROUND

Dynamic random-access memory (DRAM) is a type of random access semiconductor memory that stores each bit of data in a separate tiny capacitor within an integrated circuit. DRAM is usually arranged in a rectangular array of charge storage cells consisting of one transistor and one capacitor per (1T-1C DRAM) data bit.

In the fabrication of 1T-1C DRAM and eDRAM devices using thin film transistors, a bitline and a capacitor via may be required to extend to different heights in the device structure. Any misalignment in double patterning of these two features can result in shorting. Previous approaches to forming the bitline and capacitor via to have different heights are inadequate as they do not address patterning shorting risks.

BRIEF DESCRIPTION OF THE DRAWINGS

FIGS. 4A-4G are illustrations of front and side cross-sectional views of portions of integrated circuit layers in a method involving self-aligned bitline and capacitor via formation in accordance with an embodiment of the present disclosure.

DESCRIPTION OF THE EMBODIMENTS

Figure 1:
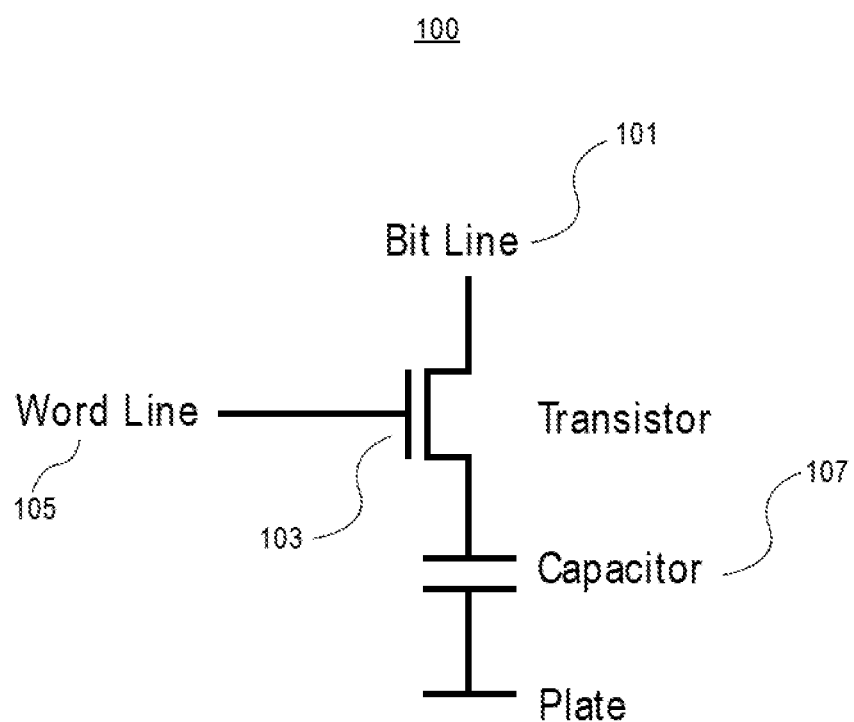
FIG. 1 is an illustration of a DRAM circuit.

Approaches for self-aligned bitline and capacitor via formation are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

FIG. 1 is an illustration of a 1T-1C DRAM memory cell 100. Referring to FIG. 1, the DRAM memory cell 100 includes bitline 101, transistor 103, wordline 105 and capacitor 107. The DRAM memory cell 100 is made up of a single MOS transistor and a storage capacitor. The bitline 101 is coupled to the source of the transistor 103, the wordline 105 is coupled to the gate of the transistor 105 and the capacitor 107 is coupled to the drain of transistor 105. Memory cells such as the DRAM memory cell 100 of FIG. 1 can be fabricated using thin film transistors. The fabrication of 1T-1C DRAM/eDRAM memory cells such as shown in FIG. 1 can involve forming the bitline and the capacitor via to extend to different heights in the physical structure of the layered integrated circuit. Any misalignment in double patterning of these features can result in shorting.

Figure 2:
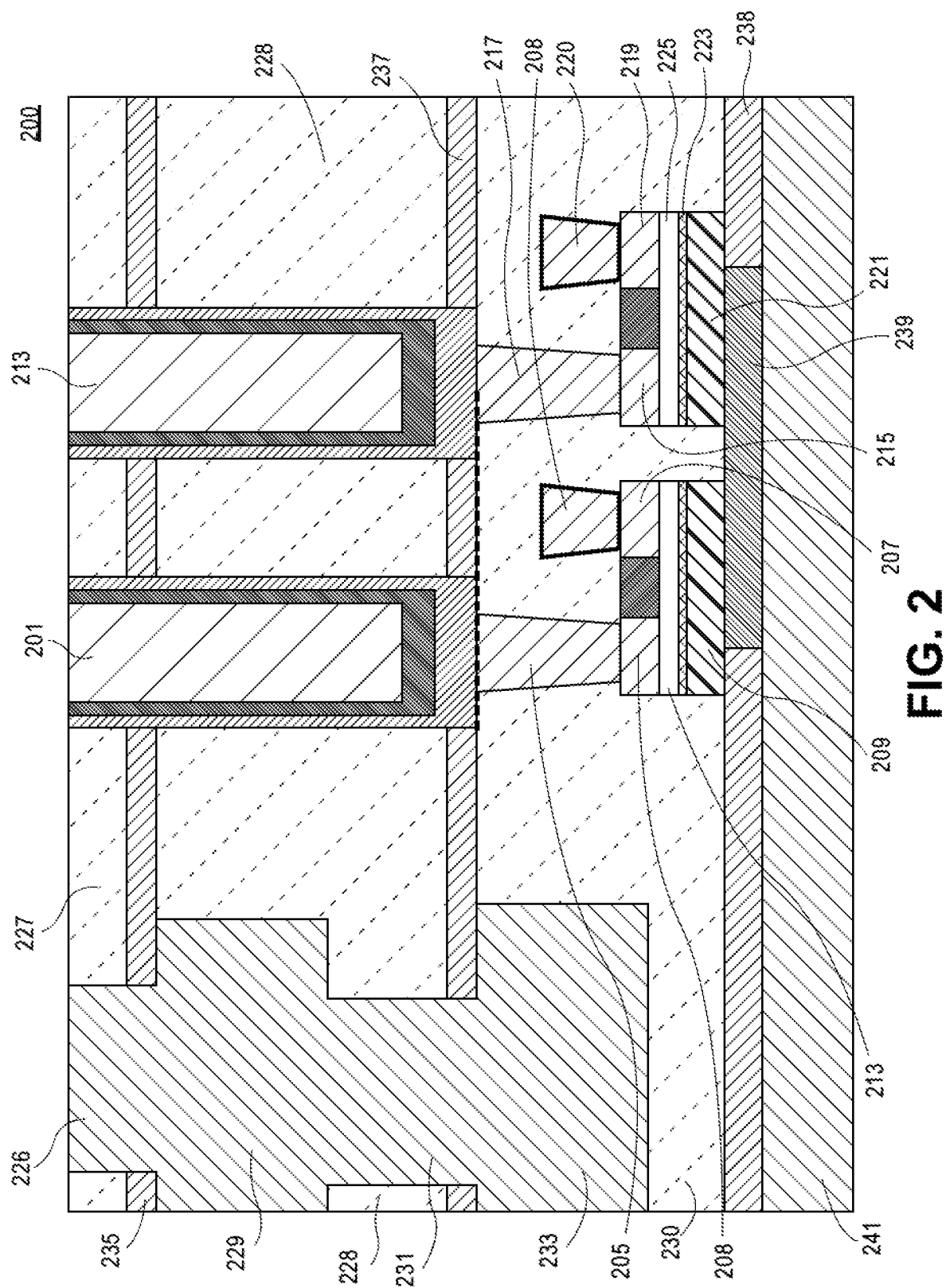
FIG. 2 is an illustration of a cross-sectional view of a 1T-1C DRAM structure fabricated using a previous approach.

FIG. 2 is an illustration of a cross sectional view of a 1T-1C DRAM structure 200 fabricated using a previous approach. The DRAM structure shown in FIG. 2 includes first memory cell C1 and second memory cell C2. The first memory cell C1 includes capacitor 201, source 203, source contact 205, drain 207, bitline 208, gate 209, gate oxide 211 and transistor channel material 213. The second memory cell C2 includes capacitor 213, source 215, source contact 217, drain 219, bitline 220, gate 221, gate oxide 223, and transistor channel material 225. FIG. 2 also shows interlayer dielectric 227, interlayer dielectric 228, interlayer dielectric 230, via 231, metal layer 229, etch stop 235, etch stop 237, etch stop 238, gate contact 239, and word line 241.

Referring to FIG. 2, with regard to the first memory cell C1, the capacitor 201 is formed to extend vertically downward through the interlayer dielectric layer 227, the etch stop layer 235 and the interlayer dielectric layer 228 to contact the top surface of the source contact 205. The source contact 205 is formed to extend vertically downward within the interlayer dielectric 230 and to contact the source 203. The bitline 208 is formed in interlayer dielectric 230 and is coupled to the drain 207. The gate 209 is formed underneath the source 203 and the drain 207 and is separated from the source 203 and the drain 207 by the gate oxide 211 and the transistor channel material 213. The gate oxide 211 is formed above the gate 209. The transistor channel material 213 is formed above the gate oxide 211 and below the source 203 and the drain 207.

Referring to FIG. 2, with regard to the second memory cell C2, the capacitor 213 is formed to extend vertically downward through the interlayer dielectric layer 227, the etch stop layer 235 and interlayer dielectric 228 and to contact the top surface of the source contact 217. The source contact 217 is formed to extend vertically downward within the interlayer dielectric 230 and to contact the source 215. The bitline 220 is formed in interlayer dielectric 230 and is coupled to the drain 219. The gate 221 is formed underneath the source 215 and the drain 219 and is separated from the source 215 and the drain 219 by the gate oxide 223 and the transistor channel material 225. The gate oxide 223 is formed above the gate 221. The transistor channel material 225 is formed above the gate oxide 223 and below the source 215 and the drain 219. The wordline 241 is formed below the etch stop layer 238 and extends horizontally from a first side of the 1T-1C DRAM structure 200 to a second side of the 1T-1C DRAM structure 200 and is coupled to C1 and C2 through contact layer 239.

Also shown in FIG. 2 is the via 226 which is formed in interlayer dielectric 227 and extends through the etch stop layer 235. The via 226 is formed above the metal layer 229. The metal layer 229 is formed above the via 231. The via 231 extends through the etch stop layer 237 and contacts the surface of the metal layer 233.

As a part of the fabrication of the DRAM structure 200 of FIG. 2, in C1, the capacitor 201 and the bitline 208 are formed to extend to different heights within the body of the structure. In addition, in C2 the capacitor 213 and the bitline 220 are formed to extend to different heights within the DRAM structure 200. To form the capacitors 201 and 213 to extend to different heights in the DRAM structure 200 than the bitlines 208 and 220 requires that a different mask be used to form the capacitors 201 and 213 and the bitlines 208 and 220.

The use of a plurality of masks to form the capacitors and the bitlines of the memory cells of DRAM structure 200, carries with it the risk of mask misalignment. The misalignment of masks can result in a shorting of the capacitor and the bitline.

It should be appreciated that each mask that is used involve the successful completion of numerous processing operations and each processing operation involves the completion of numerous other non-trivial actions. Because of such processing operations, the complexity of a process flow is often measured by the number of masks used.

In the approach of FIG. 2, the capacitor via is formed using a separate mask that is aligned to the thin film transistor. In contrast, in embodiments of the instant disclosure, the capacitor via is formed using a self-aligned process. As such, the approach of embodiments is less complex and costly than the approach that is described with reference to FIG. 2. In addition to the shorting risks described above, the FIG. 2 approach yields memory cells that exhibit increased parasitic capacitance which can cause cross-talk and noise. Embodiments of the disclosure are described herein with reference to FIG. 3 and FIGS. 4A-4G.

Figure 3:
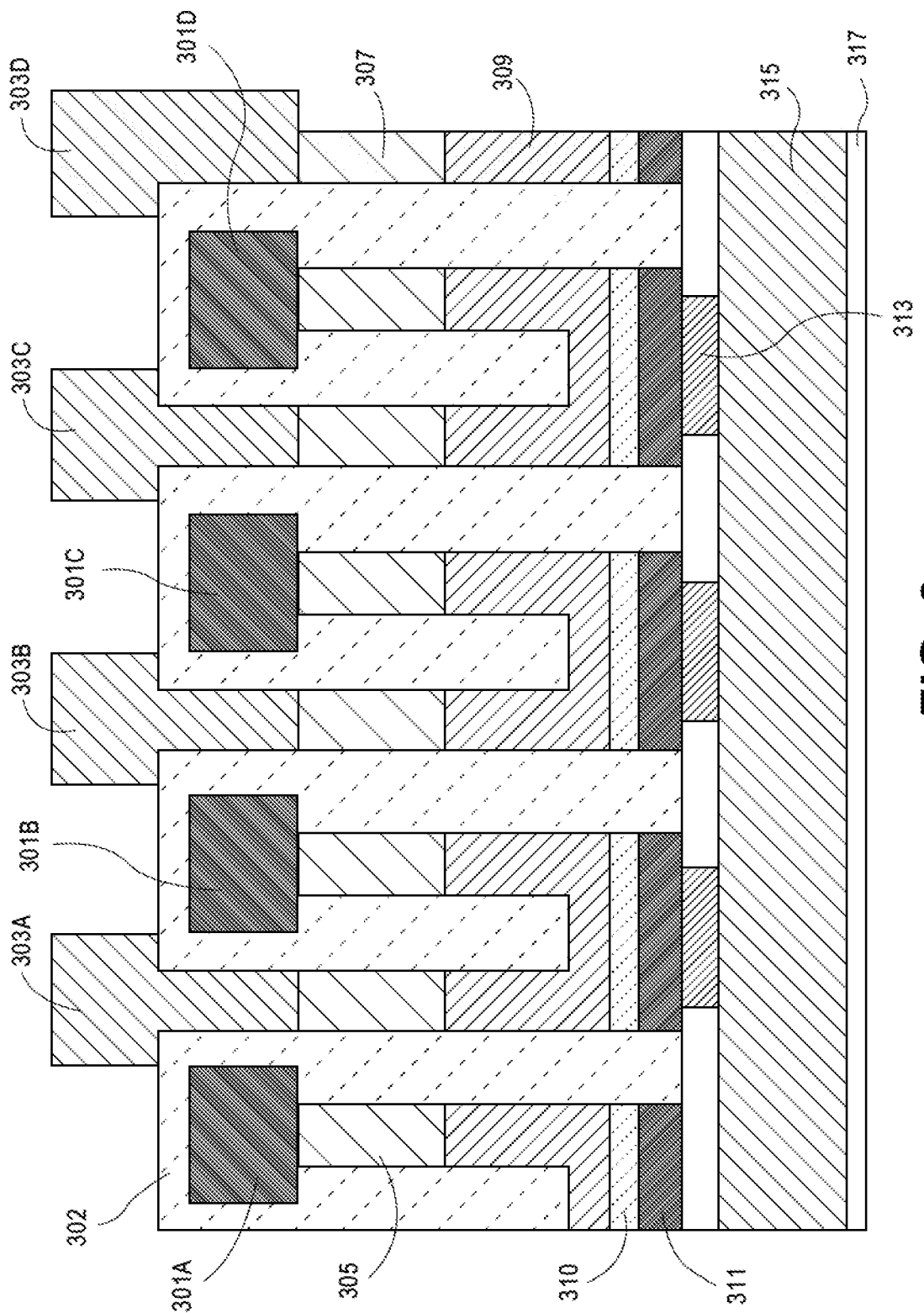
FIG. 3 is an illustration of a cross-section of a portion of a DRAM memory array in accordance with an embodiment of the present disclosure.

FIG. 3 is an illustration of a cross-section of a portion of a DRAM memory array 300 according to an embodiment. FIG. 3 shows bitlines 301a-301d, bit line encapsulant 302, capacitor landing pads 303a-303d, bitline contacts 305, capacitor landing pad contacts 307, channel material 309, gate dielectric 310, gate 311, gate contact 313, wordline 315 and substrate 317.

Referring to FIG. 3, bitlines 301a-301d are formed above bit line contacts 307. Bitline encapsulant 302 is used to encapsulate the bitlines 301a-301d, covering the top and the sides of bitlines 301a-301d. The capacitor landing pad contact 307 is formed above the channel material 309. The gate dielectric 310 is formed below channel material 309 and above the gate 311. The gate 311 is formed above gate contact 313. The gate contact 313 is formed on the top surface of wordline 315. Wordline 315 is formed on the top surface of substrate 317.

In an embodiment, the encapsulation of the bitlines 301a-301d isolates the bitline via. Moreover, the encapsulation creates a trench with a step height for the capacitor via formation. The capacitor via formation relies on the self-alignment provided by the encapsulation layer deposition (see FIGS. 4A-4G below).

As such, in an embodiment, masks are not used in the formation of the capacitor via as is done in other approaches such as that of FIG. 2. Because each mask step requires the successful completion of numerous processing operations, the process flow of embodiments is less complex and costly than the process flow of other approaches.

In an embodiment, the bitlines 301a-d can be formed from material that includes but is not limited to W, TaN, Cu, Mo, Ru, Pt, TiN, TiAlN, Pt, WSi, Wge, etc. In an embodiment, the metal contact can be formed from any metal suitable for forming the metal contact.

In an embodiment, the material used to form the bitline encapsulant 302 that surrounds and encapsulates the bitlines 301a-301d for self-alignment of the capacitor via can include but is not limited to categories of materials that are selective to surroundings such as: (1) HfO2, HfTaOx, HfSiOx, ZrOx, HfZrOx, etc. (2) SiN, AlN, SiON, AlON, AlSiN etc. (3) SiO2, IGZO, ZnO, TiO2 etc., and (4) C-doped SiO2, SiN etc. In an embodiment, any combination of these materials as a pair can be used for the isolation of the bitlines 301a-301d with respect to surroundings. In an embodiment, any suitable material can be used for the bit line encapsulant 302.

In an embodiment, the bitline contacts 305 and the capacitor landing pad contacts 307 for the transistors of the DRAM device can include but are not limited to TaN, W, WTaN, TiN, WTiN, TaTiN, AlSiN, WSi, Pt, Mo, Ru, C, Cu and multi-layers of these metals. In an embodiment, the metal contact for the transistors can be formed from any metal suitable for forming the metal contact for the transistors.

In an embodiment, the channel material 309 may be composed of semiconductor material systems including, for example, N-type or P-type materials systems. In some embodiments, the channel material 309 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In general, the channel material 309 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus, each of which may possibly be doped with one or more of gallium, indium, aluminum, fluorine, nitrogen, etc. In an embodiment, the channel material 309 can be formed from any material that is suitable for forming the channel material 309.

In an embodiment, the gate dielectric 310 can be formed from material that can include but is not limited to: HfO2, HfTaOx, Ta2O5, SiO2, SiN, HfSiN, HfSiOx, TaSiOx, Al2O3, HfAlO, TaAlO and multi-layers of these etc. In an embodiment, the gate dielectric 310 can be formed from any material suitable for forming the gate dielectric 310.

FIGS. 4A-4G are illustrations of front (PGD/Parallel to Gate Direction) and side (OGD-Orthogonal to Gate Direction) cross-sectional views of portions of integrated circuit layers 400 in a method involving self-aligned bitline and capacitor via formation in accordance with an embodiment of the present disclosure.

Referring to FIG. 4A, a formation of contact material 401, channel material 403, dielectric material 405 and gate material 407 above a structure that includes gate contacts 409a-409c, dielectric material 411, wordlines 413 and substrate material 415 is performed. In an embodiment, the contact material 401, the channel material 403, the dielectric material 405 and the gate material 407 can each be formed by deposition. In other embodiments, any other manner of forming these layers can be used. In the OGD (orthogonal to gate direction) view individual wordlines 413a-413c are shown. In an embodiment, the individual wordlines 413a-413c are used to couple the gates 407 of all transistors of a row in an array segment (in the direction orthogonal to the page). In the PGD (parallel to gate direction) view an individual wordline 416 is shown which extends the length of the cross-section and is coupled to the gate contacts 409a-409c.

In an embodiment, the contact material 401 can include but is not limited to TaN, W, WTaN, TiN, WTiN, TaTiN, AlSiN, WSi, Pt, Mo, Ru, C, Cu and multi-layers of these metals. In an embodiment, the contact material 401 can be formed from any material suitable for forming contacts for the DRAM transistors.

The channel material 403 may be composed of semiconductor material systems including, for example, N-type or P-type materials systems. In some embodiments, the channel material 403 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In general, the channel material 403 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus, each of which may possibly be doped with one or more of gallium, indium, aluminum, fluorine, nitrogen, etc. In an embodiment, the channel material 403 can include any material suitable for forming the channel material.

In an embodiment, the gate dielectric 405 can include but is not limited to oxide: HfO2, HfTaOx, Ta2O5, SiO2, SiN, HfSiN, HfSiOx, TaSiOx, Al2O3, HfAlO, TaAlO and multi-layers of these materials. In an embodiment, the gate dielectric 405 can be formed from any material suitable for forming the gate dielectric 405.

Referring to FIG. 4B, after one or more operations that result in the cross sections shown FIG. 4A, the contact material 401 and the channel material 403 is patterned. In an embodiment, the contact material 401 and the channel material 403 is patterned by etching. The PGD view and the OGD view show the structure of the contact material 401 and the channel material 403 that results from the patterning. In the PGD view, adjacent rectangular stacks that include the contact material 401 and the channel material 403 are coupled to the same wordline. In the OGD view, adjacent rectangular stacks that include the contact material 401 and the channel material 403 are coupled to different wordlines.

Figure 4C:
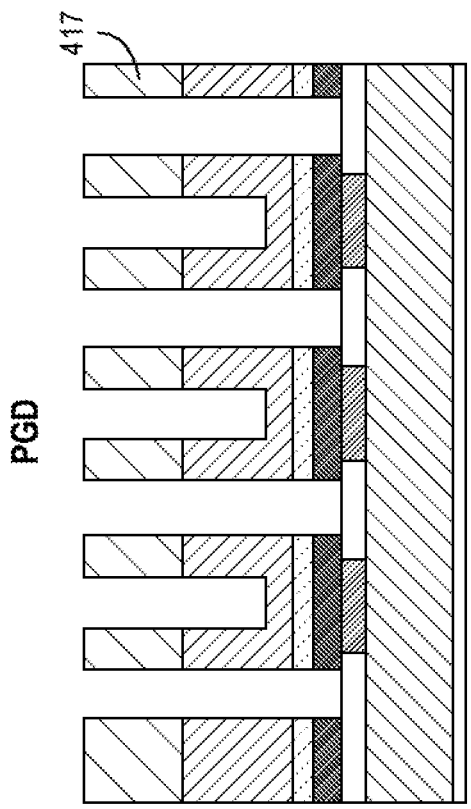
Figure 4C:
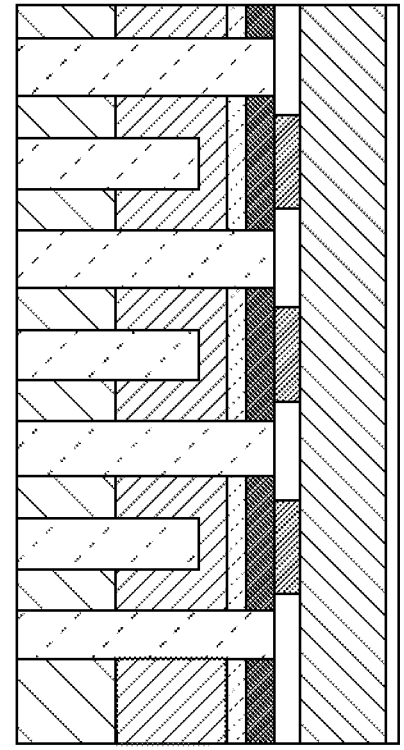

Referring to FIG. 4C, after one or more operations that result in the cross sections shown in FIG. 4B, self-aligned contacts are patterned. In an embodiment, as a part of forming the self-aligned contacts, trenches (that are visible in the PGD view) are formed in each of the adjacent rectangular stacks that include the contact material 401 and the channel material 403 that are formed in operations associated with FIG. 4B. In an embodiment, the self-aligned contacts 417 can be formed from materials that include but are not limited to TaN, W, WTaN, TiN, WTiN, TaTiN, AlSiN, WSi, Pt, Mo, Ru, C, Cu and multi-layers of these. In an embodiment, the self-aligned contacts 417 can be formed from any metal suitable for forming the self-aligned contacts 417.

Figure 4D:
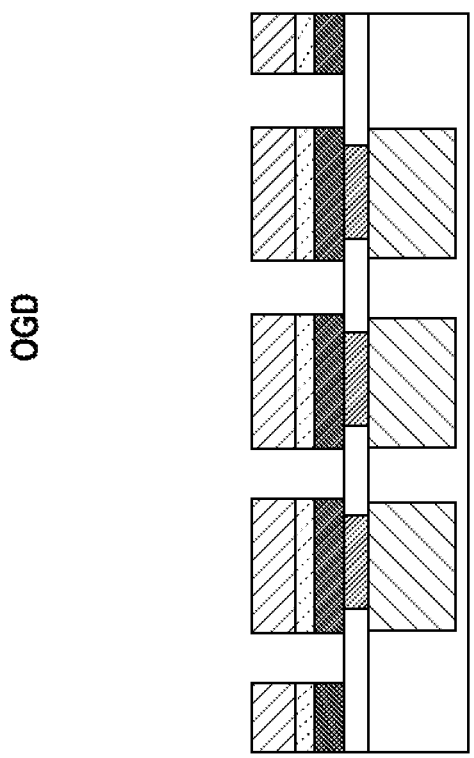
Figure 4D:
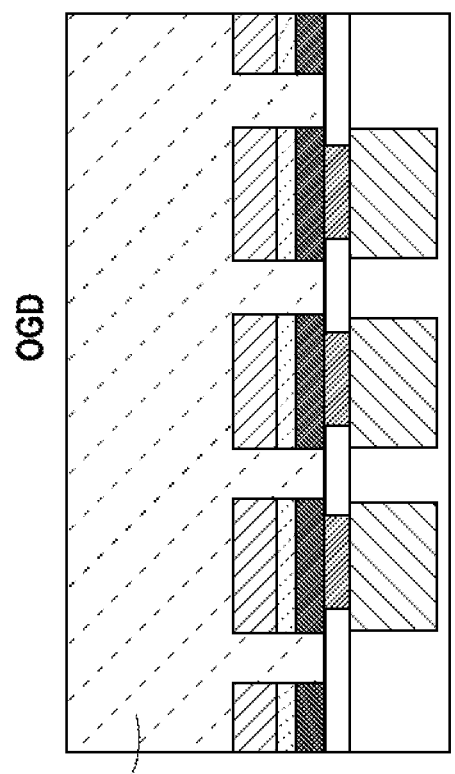

Referring to FIG. 4D, after one or more operations that result in the cross sections shown in FIG. 4C, dielectric material 419 is formed in the trenches of, and the spaces between, the adjacent rectangular stacks corresponding to the patterned self-aligned contacts 417. In an embodiment, the material that is formed in the trenches of, and in the spaces between, the rectangular stacks that include the self-aligned contacts 417 fills the trenches of, and the spaces between the rectangular stacks that include the self-aligned contacts 417 to a height that is level with the top surfaces of the adjacent rectangular stacks.

Referring to FIG. 4E, after one or more operations that result in the cross sections shown in FIG. 4D, bitline material 421 is formed above the self-aligned contacts 417 and the dielectric material 419 and is patterned to form bitlines 421a-421d. The OGD view shows that the bitlines extend the length of the cross-section of the integrated circuit 400. The PGD view shows that the material is patterned to form individual bit lines 421a-421d that are coupled to the self-aligned contacts 417. In an embodiment, the bitline material 421 can include but is not limited to W, TaN, Cu, Mo, Ru, Pt, TiN, TiAlN, Pt, WSi, and WGe. In an embodiment, the bitline material 421 can include any material suitable for use as bitline material 421.

Referring to FIG. 4F, after one or more operations that result in the cross sections shown in FIG. 4E, etch selective dielectric material 423 is formed on the top and side surfaces of the bitline structures 421a-421d (see PGD view). The etch selective dielectric material 423 is an etch selective material that is used to encapsulate the bitline structures 421a-421d. In an embodiment, as shown in the OGD view, the etch selective dielectric material 423 is formed to extend the entire length of the bitline structures 421. In an embodiment, the etch selective dielectric material 423 can include but is not limited to groups of materials such as: (1) HfO2, HfTaOx, HfSiOx, ZrOx, HfZrOx, etc., (2) SiN, AlN, SiON, AlON, AlSiN etc., (3) SiO2, IGZO, ZnO, TiO2 etc., and (4) C-doped SiO2, SiN etc. In an embodiment, any combination of these materials as a pair can be used for bitline isolation with respect to surroundings. In an embodiment, any suitable material etch selective material can be used for etch selective material 423.

Figure 4G:
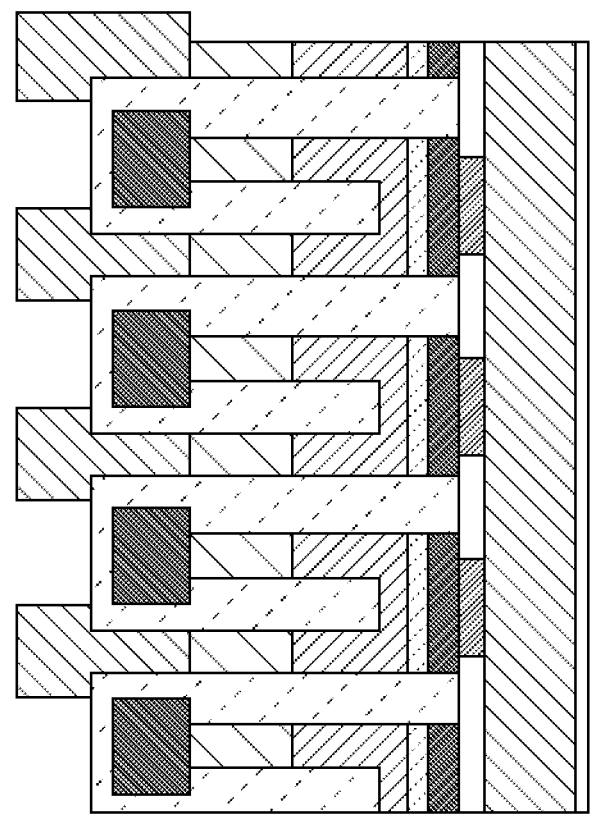
Figure 4G:
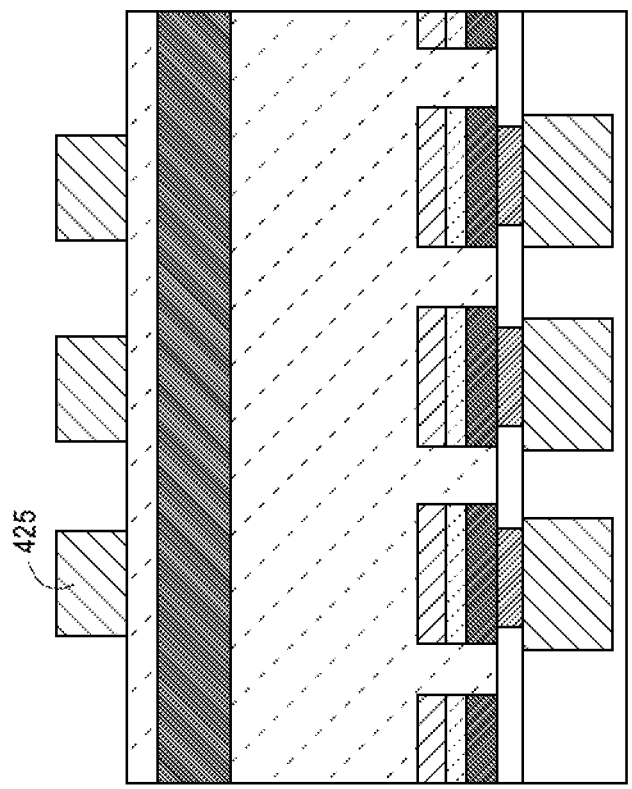

Referring to FIG. 4G, after one or more operations that result in the cross sections shown in FIG. 4F, the etch selective material at the bottom of the trenches formed between the bitline structures 421a-421d is removed to form vias. Thereafter, metal material is formed in the vias and on the top surfaces of the etch selective material. The metal material is then patterned to form capacitor landing pads 425 as shown in FIG. 4G.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
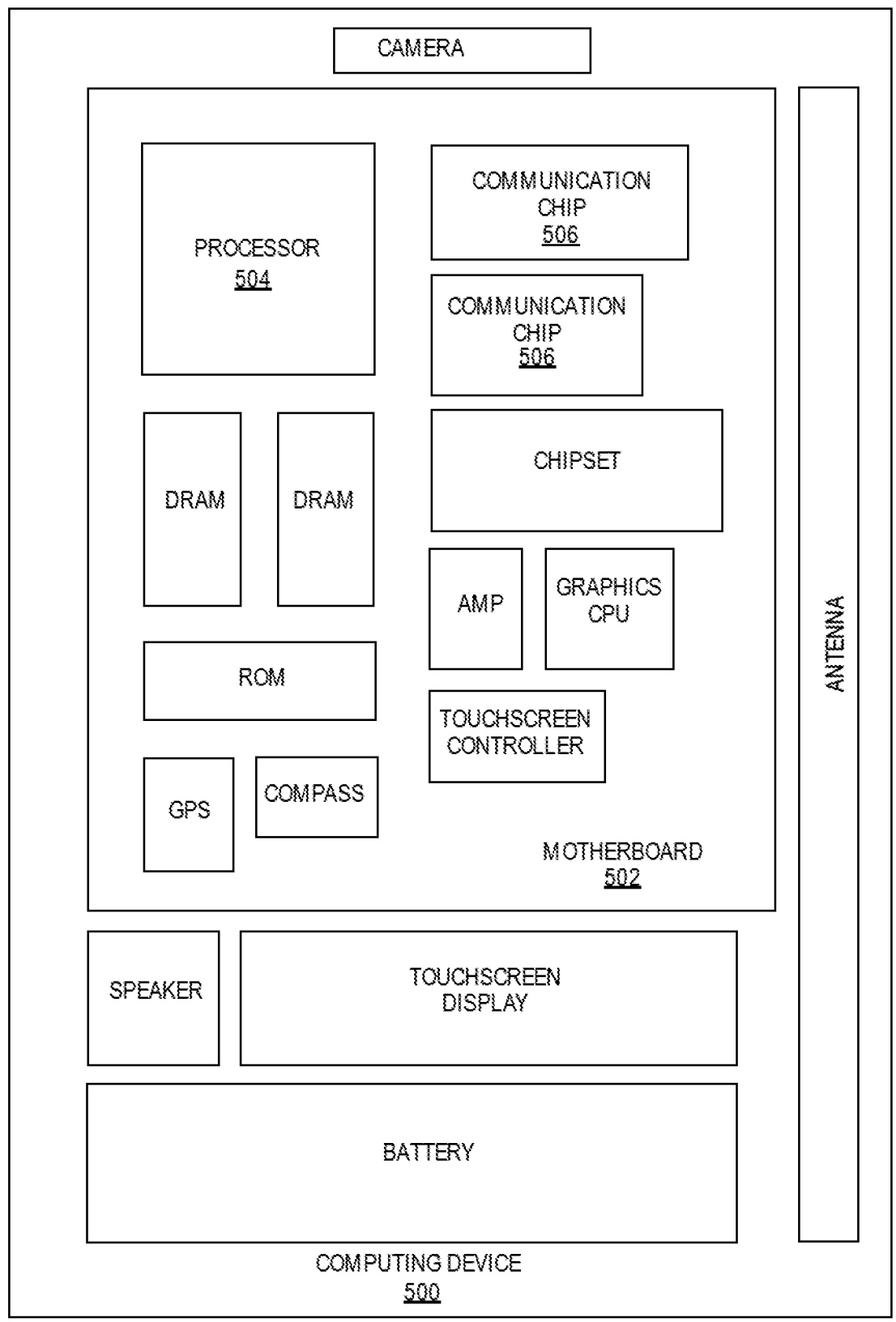
FIG. 5 illustrates a computing device in accordance with an embodiment of the present disclosure.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
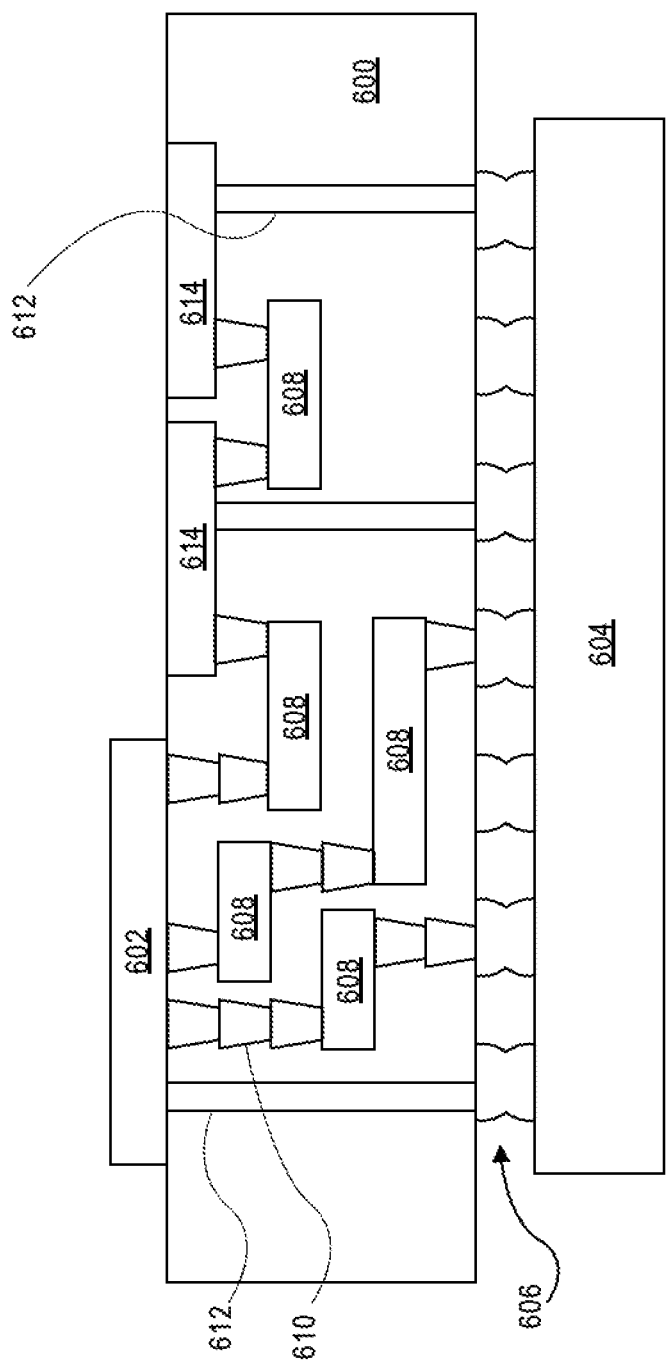
FIG. 6 illustrates an interposer that includes one or more embodiments of the present disclosure.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 400.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Embodiment 1

A method includes forming bit line structures above bitline contact structures, forming a first material on top surfaces and sidewall surfaces of the bit line structures to establish step structures for via formation and forming a second material on the top surface of the first material. Capacitor landing structures are formed by patterning the second material.

Embodiment 2

The method of example embodiment 1 wherein the bitline structures are formed from a patterning of material formed on the surface of the bitline contact structures.

Embodiment 3

The method of example embodiment 1 wherein the forming the first material on the top surfaces and the sidewall surfaces of the bitline structures define capacitor vias.

Embodiment 4

The method of example embodiment 1 wherein the forming the first material on the top surfaces and the sidewall surfaces of the bitline structures isolates the bitline structures.

Embodiment 5

The method of example embodiment 1 wherein the capacitor landing structure is self-aligned.

Embodiment 6

The method of example embodiment 1 wherein a distance between similar sidewall surfaces of the bitline structures is 135 nm.

Embodiment 7

The method of example embodiment 1, 2, 3, 4, 5, or 6 wherein the bitline contact structures are defined by trenches.

Embodiment 8

A method includes forming a layer of gate material above a layer of wordline material, forming a first layer of dielectric material above the layer of gate material, forming a layer of channel material above the first layer of dielectric material and forming a plurality of layered stacks of material from the layer of gate material, forming the first layer of dielectric material and the layer of channel material, forming trenches that extend into the plurality of layered stacks of material, forming a second layer of dielectric material in the trenches and between the plurality of layered stacks of material, forming bit line structures above bitline contact structures, and forming a third layer of dielectric material on top surfaces and sidewall surfaces of the bit line structures, and forming capacitor landing material on the top surfaces and the sidewall surfaces of the third layer of dielectric material. The capacitor landing material is patterned to form capacitor landing structures.

Embodiment 9

The method of example embodiment 8 wherein the bitline structures are formed from a patterning of material formed on the surfaces of the bitline contact structures.

Embodiment 10

The method of example embodiment 8 wherein the forming the third layer of dielectric material on the top surfaces and the sidewall surfaces of the bitline structures define capacitor vias.

Embodiment 11

The method of example embodiment 8 wherein the forming the third layer of dielectric material on the top surfaces and the sidewall surfaces of the bitline structures isolates the bitline structures.

Embodiment 12

The method of example embodiment 8 wherein the capacitor landing structures are self-aligned.

Embodiment 13

The method of example embodiment 8 wherein a distance between similar sidewall surfaces of the bitline structures is 135 nm.

Embodiment 14

The method of example embodiment 8, 9, 10, 11, 12, or 13 wherein the bitline contact structures are defined by trenches.

Embodiment 15

A DRAM memory cell structure includes a bottom gate, dielectric formed above the bottom gate, channel material formed above the dielectric including a first portion that is parallel to the gate and second and third portions that are orthogonal to the gate, and a capacitor landing structure coupled to the second portion of the channel material. A bitline is coupled to the third portion of the channel material wherein the capacitor landing structure is extends above the bitline.

Embodiment 16

The DRAM structure of example embodiment 15 further comprising a first material on the top surfaces and the sidewall surfaces of the bitline structures that define capacitor vias.

Embodiment 17

The DRAM structure of example embodiment claim 16 wherein the first material on the top surfaces and the sidewall surfaces of the bitline structures electrically isolates the bitline structures.

Embodiment 18

The DRAM structure of example embodiment 15 further comprising a gate contact coupled to the gate structure.

Embodiment 19

The DRAM structure of example embodiment 15 further comprising a wordline structure coupled to the gate contact.

Embodiment 20

The DRAM structure of example embodiment 15, 16, 17, 18, or 19 further comprising a capacitor coupled to the capacitor landing structure.

What is claimed is:

1. A method, comprising:
    forming bit line structures above bitline contact structures;
    forming a first material on top surfaces and sidewall surfaces of the bit line structures, the first material conformal with the bit line structures and having trenches laterally between adjacent ones of the bit line structures, the trenches over portions of the first material;
    removing the portions of the first material by extending the trenches to establish step structures of the first material for via formation, the step structures of the first material having an uppermost surface;
    forming a second material on the step structures of the first material; and
    forming capacitor landing structures by patterning the second material, wherein a portion of the capacitor landing structures comprises a metal-containing material laterally adjacent to the bitline structures, the metal-containing material having a bottommost surface at a same level as a bottommost surface of the bitline structures, and the metal-containing material having an uppermost surface above the uppermost surface of the step structures of the first material.

2. The method of claim 1, wherein the bitline structures are formed from a patterning of material formed on the surface of the bitline contact structures.

3. The method of claim 1, wherein the forming the first material on the top surfaces and the sidewall surfaces of the bitline structures define capacitor vias.

4. The method of claim 1, wherein the forming the first material on the top surfaces and the sidewall surfaces of the bitline structures isolates the bitline structures.

5. The method of claim 1, wherein the capacitor landing structure is self-aligned.

6. The method of claim 1, wherein a distance between similar sidewall surfaces of the bitline structures is 135 nm.

7. The method of claim 1, wherein the bitline contact structures are defined by trenches.

8. A method, comprising:
    forming a layer of gate material above a layer of wordline material;
    forming a first layer of dielectric material above the layer of gate material;
    forming a layer of channel material above the first layer of dielectric material;
    forming a plurality of layered stacks of material from the layer of gate material, the first layer of dielectric material and the layer of channel material;
    forming trenches that extend into the plurality of layered stacks of material;
    forming a second layer of dielectric material in the trenches and between the plurality of layered stacks of material;
    forming bit line structures above bitline contact structures;
    forming a third layer of dielectric material on top surfaces and sidewall surfaces of the bit line structures;
    forming capacitor landing material on the top surfaces and the sidewall surfaces of the third layer of dielectric material; and
    patterning the capacitor landing material to form capacitor landing structures.

9. The method of claim 8, wherein the bitline structures are formed from a patterning of material formed on the surfaces of the bitline contact structures.

10. The method of claim 8, wherein the forming the third layer of dielectric material on the top surfaces and the sidewall surfaces of the bitline structures define capacitor vias.

11. The method of claim 8, wherein the forming the third layer of dielectric material on the top surfaces and the sidewall surfaces of the bitline structures isolates the bitline structures.

12. The method of claim 8, wherein the capacitor landing structures are self-aligned.

13. The method of claim 8, wherein a distance between similar sidewall surfaces of the bitline structures is 135 nm.

14. The method of claim 8, wherein the bitline contact structures are defined by trenches.

15. A DRAM memory cell structure, comprising:
    a bottom gate;
    a dielectric formed above the bottom gate;
    channel material formed above the dielectric comprising a first portion that is parallel to the gate and second and third portions that are orthogonal to the gate;
    a capacitor landing structure coupled to the second portion of the channel material; and
    a bitline coupled to the third portion of the channel material wherein the capacitor landing structure is extends above the bitline, and wherein the capacitor landing structure has a bottommost surface at a same level as a bottommost surface of the bitline.

16. The DRAM structure of claim 15, further comprising a first material on the top surfaces and the sidewall surfaces of the bitline structures that define capacitor vias.

17. The DRAM structure of claim 16, wherein the first material on the top surfaces and the sidewall surfaces of the bitline structures electrically isolates the bitline structures.

18. The DRAM structure of claim 15, further comprising a gate contact coupled to the gate structure.

19. The DRAM structure of claim 18, further comprising a wordline structure coupled to the gate contact.

20. The DRAM structure of claim 15, further comprising a capacitor coupled to the capacitor landing structure.

* * * * *